(12) United States Patent
Alam et al.

(10) Patent No.: US 9,196,342 B2
(45) Date of Patent: Nov. 24, 2015

(54) CIRCUIT AND METHOD FOR SPIN-TORQUE MRAM BIT LINE AND SOURCE LINE VOLTAGE REGULATION

(71) Applicant: Everspin Technologies, Inc., Chandler, AZ (US)

(72) Inventors: Syed M. Alam, Austin, TX (US); Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/676,100

(22) Filed: Apr. 1, 2015

(65) Prior Publication Data

US 2015/0206570 A1    Jul. 23, 2015

Related U.S. Application Data

(63) Continuation of application No. 13/720,183, filed on Dec. 19, 2012, now Pat. No. 9,047,965.

(60) Provisional application No. 61/578,092, filed on Dec. 20, 2011.

(51) Int. Cl.
*G11C 11/00* (2006.01)
*G11C 11/16* (2006.01)

(52) U.S. Cl.
CPC ............ *G11C 11/1693* (2013.01); *G11C 11/16* (2013.01)

(58) Field of Classification Search
CPC ...... G11C 11/16; G11C 15/02; G11C 15/046; G11C 11/5607
USPC .......................... 365/194, 158, 185.18, 189.11
See application file for complete search history.

(56) References Cited

U.S. PATENT DOCUMENTS

| | | | |
|---|---|---|---|
| 2003/0081453 A1* | 5/2003 | Hidaka | 365/173 |
| 2003/0142540 A1* | 7/2003 | Tanizaki et al. | 365/171 |

* cited by examiner

*Primary Examiner* — Tuan T Nguyen

(57) ABSTRACT

Circuitry and a method for regulating voltages applied to magnetoresistive bit cells of a spin-torque magnetoresistive random access memory (ST-MRAM) reduces time-dependent dielectric breakdown stress of the word line transistors. During a read or write operation, only the ends of the selected bit cells are pulled down to a low voltage and/or pulled up to a high voltage depending on the operation (write 0, write 1, and read) being performed. The ends of the unselected bit cells are held at a precharge voltage while separately timed signals pull up or pull down the ends of the selected bit cells during read and write operations.

20 Claims, 7 Drawing Sheets

CIRCUIT AND METHOD FOR SPIN-TORQUE MRAM BIT LINE AND SOURCE LINE VOLTAGE REGULATION

CROSS REFERENCE TO RELATED APPLICATIONS

This application is a continuation of U.S. patent application Ser. No. 13/720,183, filed Dec. 19, 2012 (still pending). This application and U.S. patent application Ser. No. 13/720,183 claim priority to and the benefit of U.S. Provisional Application No. 61/578,092, filed Dec. 20, 2011. The contents of U.S. patent application Ser. No. 13/720,183 and U.S. Provisional Application No. 61/578,092 are incorporated by reference herein in their entirety.

TECHNICAL FIELD

The exemplary embodiments described herein generally relate to a spin-torque MRAM and more particularly to bit line and source line voltage regulation when writing to and reading from a spin-torque MRAM.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. A high magnetoresistance (MR) value, which is the ratio of the resistance difference of the two states to the low resistance state, is desirable for increasing sensing signal and fast read operation.

There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-transfer torque RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bit cell select devices in both current directions can limit the scalability of ST-MRAM. The write current is typically higher in one direction compared to the other, so the select device must be capable of passing the larger of the two currents. In addition, ST-MRAM switching current requirements increase as the write current pulse duration is reduced. Because of this, the smallest ST-MRAM bitcell approach may require relatively long switching times.

The conventional scheme for programming spin-torque MRAM is to apply a single current or voltage pulse to the memory cells to reverse the direction of their storage layer. The duration of the pulse is set by design requirements such as memory interface specifications. Generally, the write operation has to be completed in less than 50 ns. The write voltage amplitude is set to meet the memory write error rate (WER) and lifetime requirements. It has to be greater than a certain value Vw to assure that all bits are programmed reliably, with a write error rate below a defined value $WER_0$. For megabit memories, $WER_0$ is typically less than $10^{-8}$. The write voltage amplitude also has to be low enough to assure long-term device integrity. For magnetic tunnel junctions, elevated write voltage reduces the memory lifetime because of dielectric breakdown. In some cases, it is not possible to find a write voltage that meets the desired write error rate $WER_0$ and the required lifetime. Known solutions to improve the write error rate are adding one or several layers of error correction or using multiple write pulses.

An ST-MRAM array includes a plurality of core strips, with each core strip including a bit cell array comprising a plurality of columns of bit cells (a magnetic tunnel junction and a word line select transistor). In a column of ST-MRAM bit cells, only one row is selected for reading or writing with a positive voltage at the gate (control electrode) of the word line select transistor.

In a column of bit cells, a first end of the magnetic tunnel junctions is connected to a first common line referred to as bit line. The second end of the magnetic tunnel junctions connects to the first current carrying electrode of their respective word line select transistor. The second current carrying electrodes of the word line select transistors are connected to a second common line referred to as source line. Due to a large number, for example 512 or 1024, of bit cells in a column, bit and source lines are long metal routes that can have significant resistance. When writing a bit far away from either the top or bottom end of a column using a write driver, current through the bit and source lines causes voltage drop due to line resistance reducing the applied voltage across the magnetic tunnel junction.

It is desirable to reduce effective resistance of all the components, for example metal resistance and word line select device resistance, in the path during reading from or writing to a selected bit cell by applying different voltages at its bit line and source line. In order to reduce the resistance from the word line select device, the gate (control electrode) can be charge pumped to a higher voltage than the supply voltage. However, the pumped word line gate voltage raises the possibility of time dependent dielectric breakdown (TDDB). One known circuit (see U.S. Pat. No. 7,190,612) discloses a NAND gate output going to an inverter and controls two switches, for example, one switch connecting the bit line or source line to a first reference voltage and a second switch connecting the bit line or source line to a second reference voltage. However, this known patent teaches the voltage applications being controlled by the same timing signal. Pumped word line voltages may cause reliability problems in such an implementation.

Another circuit (see U.S. Patent Publication Number 2010/0110775A1) describes pumped word line voltages, and separate switches for read, write with set current pulse, and write with reset current pulse. However, there is no disclosure of timing control for write and read switches, and the pumped word line voltages can cause reliability problems.

Accordingly, circuitry for sense amplifiers, write drivers, and column selection is needed that provides a higher write voltage across the magnetic tunnel junction during write and higher effective MR during read, while avoiding time dependent dielectric breakdown (TDDB) stress of the word line select devices in the selected row. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

Circuitry and a method for regulating voltages applied to source and bit lines of a spin-torque magnetoresistive random access memory are provided.

A first exemplary embodiment is a method for writing to and reading from a spin-torque MRAM having a first source line, a second source line, a first bit line, a second bit line, a first plurality of magnetic tunnel junction cells coupled between the first source line and the first bit line, and a second plurality of magnetic tunnel junction cells coupled between the second source line and the second bit line, comprising applying a first voltage to the first source line or the first bit line; and subsequently applying a second voltage to the other of the first source line or the first bit line from which the first voltage is applied.

A second exemplary embodiment is a method for writing to and reading from a spin-torque MRAM having a first source line, a second source line, a first bit line, a second bit line, each of a first plurality of magnetic tunnel junction cells coupled in series with one each of a plurality of word line select transistors between the first source line and the first bit line, and a second plurality of magnetic tunnel junction cells coupled in series with one each of a second plurality of word line select transistors between the second source line and the second bit line, comprising applying a first voltage at each of the first source line, first bit line, second source line, and second bit line; applying a word line voltage to one word line select transistor of each first and second pluralities of word line select transistors; isolating the first source line and first bit line from the first voltage; applying a second voltage at one of the first bit line or first source line; applying a third voltage at the other of the first bit line or first source line at which the second voltage is applied; isolating the third voltage from the first bit line or first source line at which it was applied; isolating the second voltage from the first bit line or first source line at which it was applied; and reapplying the first voltage at each of the first source line and second source line.

A third exemplary embodiment is a spin-torque MRAM, comprising a first source line; a second source line; a first bit line; a second bit line; a first plurality of first magnetic bit cells each coupled between the first source line and the first bit line; a second plurality of second magnetic bit cells each coupled between the second source line and the second bit line; a word line driver configured to selectively activate one of the first magnetic bit cells and one of the second magnetic bit cells; a column selection circuit coupled to each of the first and second source lines and the first and second bit lines and configured to apply a precharge voltage to the first and second source lines and the first and second bit lines; sense amplifiers and write drivers circuitry coupled to the column selection circuitry; and column circuit drivers circuitry coupled to the sense amplifiers and write drivers circuitry and the column selection circuitry.

BRIEF DESCRIPTION OF THE DRAWINGS

The present invention will hereinafter be described in conjunction with the following drawing figures, wherein like numerals denote like elements.

DETAILED DESCRIPTION

Figure 1:
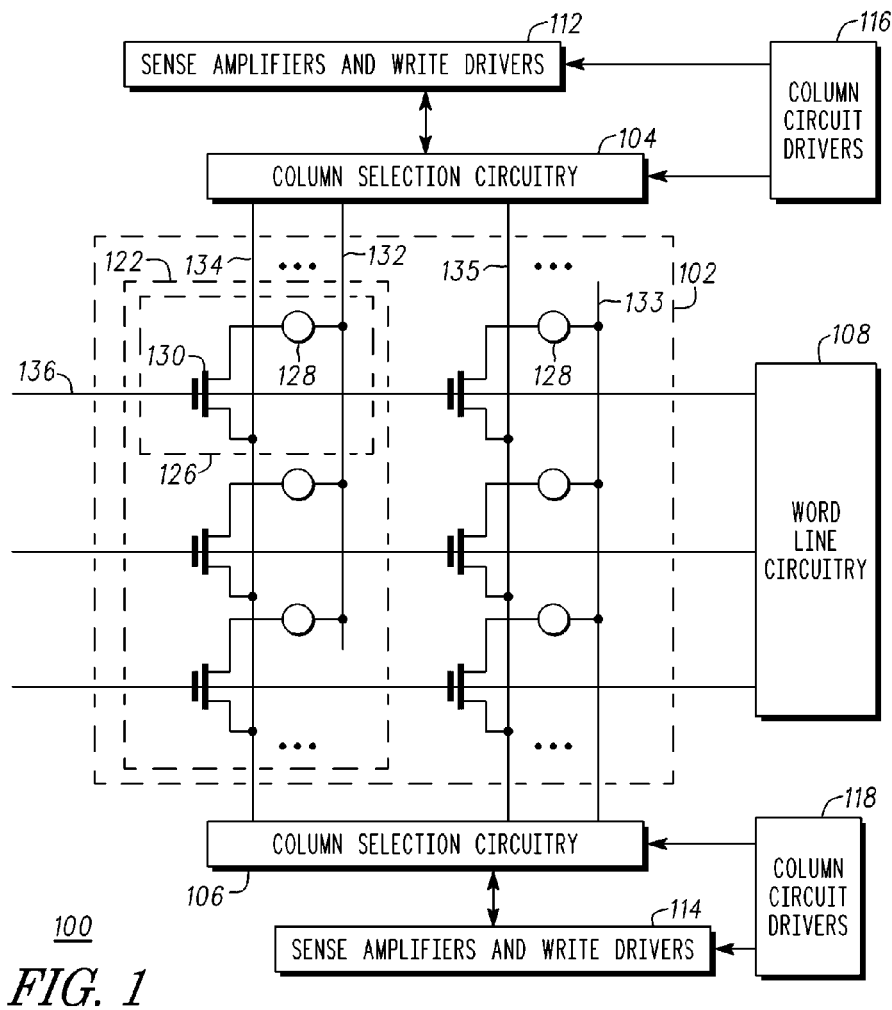
FIG. 1 is a partial general circuit diagram of an ST-MRAM in accordance with a first exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A spin-torque magnetoresistive random access memory (ST-MRAM) array comprises of a plurality of magnetic tunnel junctions, each coupled to a word line select transistor connected to each of a plurality of source lines and bit lines. All the bit lines and source lines are elevated to a higher than ground voltage (vbq) upon power up and are maintained at vbq in a steady state. During a read or write operation, only the selected (an addressed subset of all) bit lines and source lines are pulled-down to a low voltage and/or pulled-up to a high voltage depending on the operation (write 0, write 1, and read) being performed. The word line select transistor gate or control electrode voltage is a charge pumped voltage the magnitude of which is determined by the pulled-down or pulled-up voltages at the selected bit lines and source lines to avoid time dependent dielectric breakdown stress of the word line select transistors in the selected bit lines and source lines. The unselected bit lines and source lines are held at the vbq voltage level. The magnitude of the vbq voltage is determined by the magnitude of the word line select transistor gate or control electrode voltage to avoid time dependent dielectric breakdown stress of the word line select transistors in the unselected bit lines and source lines. Separately timed switch control signals and a logic circuit are used for pull-up or pull-down of the selected bit lines and source lines during read and write operations. A method of operation further includes delaying pull-down timing from pull-up timing by a fixed or programmable delay. During power-up and steady state, all the bit lines and source lines are precharged to a vbq voltage level with a precharge transistor on each side of the column selection transistors for each bit line and source line. In response to a read or write operation, the vbq precharge transistor of the selected column at the current carrying electrode of column selection transistors not connected to the bit line or source line is disabled subsequent to (by a fixed or programmable delay) the precharge transistor of the selected column at the other current carrying electrode connected to the bit line or source line. Column selection transistors are placed at both the top and bottom sides of the array Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers are used to identify like elements according to the different figures that illustrate the various exemplary embodiments.

An MRAM array includes write drivers and sense-amplifiers positioned near a plurality of magnetoresistive bits. A write, or program, operation begins when a current of either one of the two different and opposite polarities, set or reset, is applied through the magnetic storage element, e.g., magnetic tunnel junction (MTJ). Such write mechanism is employed in spin-transfer torque (STT) or spin torque (ST) MRAM. The spin-torque effect is known to those skilled in the art. Briefly, a current becomes spin-polarized after the electrons pass through the first magnetic layer in a magnetic/non-magnetic/magnetic tri-layer structure, where the first magnetic layer is substantially more magnetically stable than the second magnetic layer. The higher magnetic stability of the first layer compared to the second layer may be determined by one or more of several factors including: a larger magnetic moment due to thickness or magnetization, coupling to an adjacent antiferromagnetic layer, coupling to another ferromagnetic layer as in a synthetic antiferromagnetic (SAF) structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

FIG. 1 is a partial schematic diagram of an ST-MRAM array 100 in accordance with the exemplary embodiment. An ST-MRAM bit cell array 102 is coupled to first and second column selection circuitry 104, 106 and to word line circuitry 108. First and second sense amplifiers and write drivers circuitry 112, 114 are coupled to the first and second column selection circuitry 104, 106, respectively. First column circuit drivers circuitry 116 is coupled to the first column selection circuitry 104 and the first sense amplifiers and write drivers circuitry 112. Second column circuit drivers circuitry 118 is coupled to the second column selection circuitry 106 and the second sense amplifiers and write drivers circuitry 114. The write drivers operate to write data to the bit cell array 102 and the sense amplifier operates by reading data from the array 102. For simplicity and brevity, other known circuit blocks in a memory, such as data storage latches, address decoders, and timing circuitry, are not shown in FIG. 1.

The ST-MRAM array 100 includes a plurality of columns 122 with each column including a plurality of magnetic bit cells 126. Each magnetic bit cell 126 includes a magnetic tunnel junction device 128 and a word line select transistor 130. Within each column 122, each magnetic tunnel junction device 128 is coupled between a bit line 132, 133 and a first electrode of a word line select transistor 130, while a second electrode of each word line select transistor 130 is coupled to a source line 134, 135. A control electrode of each word line select transistor 130 is coupled to a voltage word line 136 within the word line circuitry 108. Each one of the voltage word lines 136 is coupled to a single row of word line select transistors. The word line select transistor 130 preferably is a thin-oxide device with low threshold voltage for a higher current drive capability.

The first exemplary embodiment described above provides voltages at both ends of each source lines 134, 135, while alternating adjacent bit lines 132, 133 are coupled, one at a first end and the other at the opposed second end. The source line resistance is one fourth of the resistance of an array connected only at one end of the source line, which leads to a higher write voltage and higher effective MR during read. Word line circuitry 108 comprises word line drivers that may provide a charge pumped voltage on word line 136. The charge pumped word line voltage reduces the resistance of the word line select transistor 130.

Figure 2A:
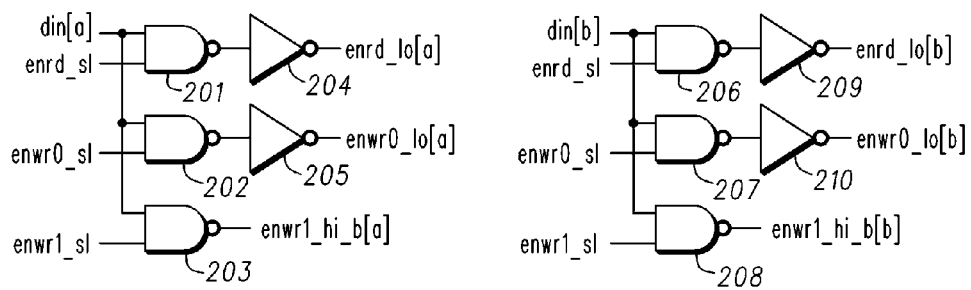
FIGS. 2A-2D are a more detailed partial circuit diagram in accordance with a second exemplary embodiment.

FIGS. 2A, 2B, 2C, and 2D are a more detailed circuit diagram of the ST-MRAM 100 in accordance with a second exemplary embodiment. It should be noted that all components of this exemplary embodiment as illustrated in FIGS. 2A, 2B, 2C, and 2D that are similar to components of the exemplary embodiment of FIG. 1 are designated with like numbers. Referring first to FIG. 2A, NAND gates 201, 202, 203 each have a first input coupled to receive a first data input signal din[a], and a second input coupled to receive a source line enable read signal enrd_sl, a source line enable write 0 signal enwr0_sl, and a source line enable write 1 signal enwr1_sl, respectively. An inverter 204 has an input coupled to receive an output of the NAND gate 201 and provides a first enable read low signal enrd_lo[a]. An inverter 205 has an input coupled to receive an output of the NAND gate 202 and provides a first enable write 0 low signal enwr0_lo[a]. An output of the NAND gate 203 provides a first enable write 1 high signal enwr1_hi_b[a].

NAND gates 206, 207, 208 each have a first input coupled to receive a second data input signal din[b], and a second input coupled to receive the source line enable read signal enrd_sl, the source line enable write 0 signal enwr0_sl, and the source line enable write 1 signal enwr1_sl, respectively. An inverter 209 has an input coupled to receive an output of the NAND gate 206 and provides a second enable read low signal enrd_lo[b]. An inverter 210 has an input coupled to receive an output of the NAND gate 207 and provides a second enable write 0 low signal enwr0_lo[b]. An output of the NAND gate 208 provides a second enable write 1 high signal enwr1_hi_b[b]. Note that the first and second data input signals din[a] and din[b] can represent two bits from a data input bus din.

Figure 2B:
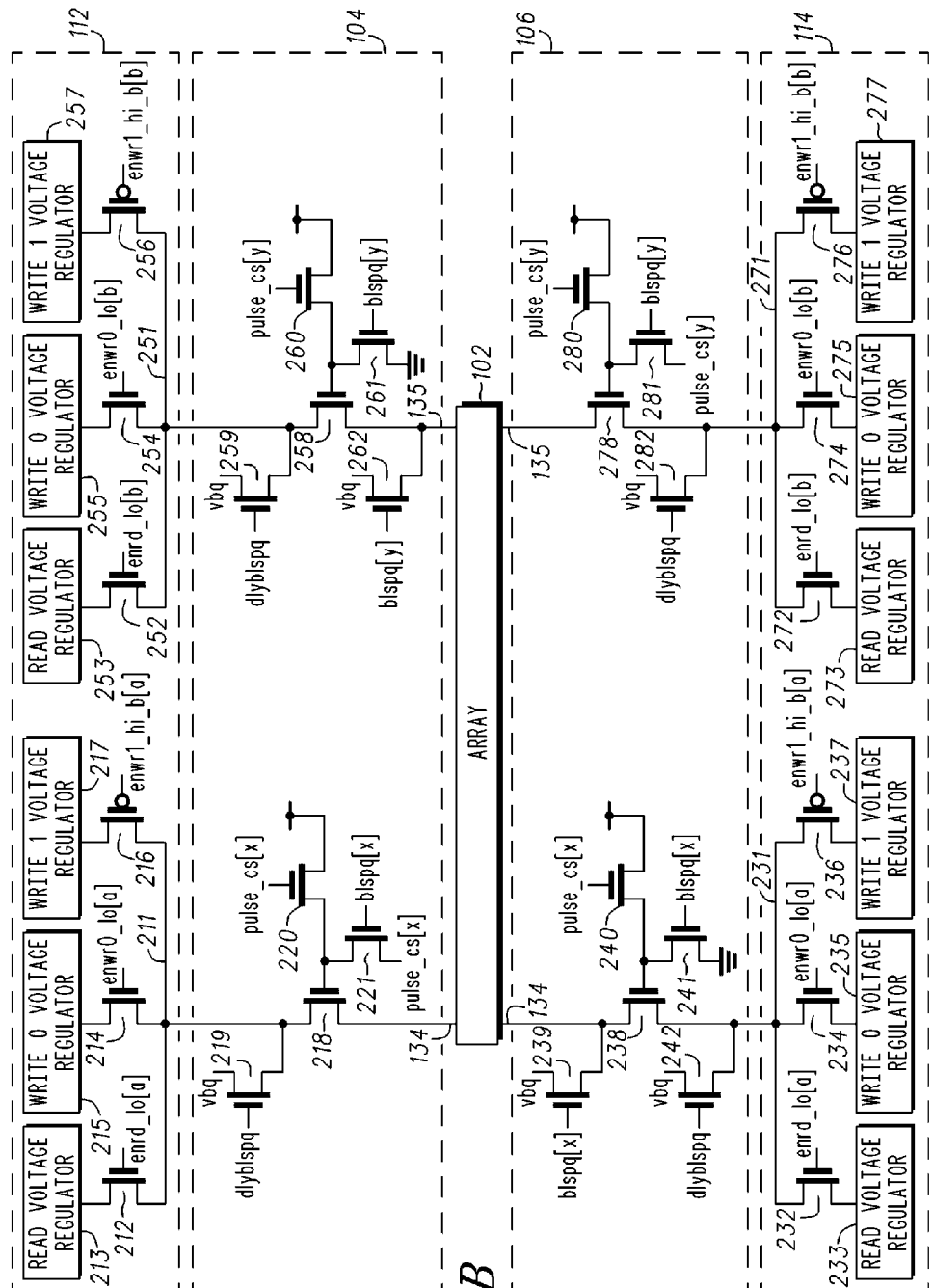

Referring to FIG. 2B, the sense amplifiers and write drivers circuitry 112 of the second embodiment includes a transistor 212 having a first current carrying electrode connected to a read voltage regulator 213 for receiving a read voltage, a second current carrying electrode coupled to a node 211, and a control electrode coupled to receive the signal enrd_lo[a]. A transistor 214 has a first current carrying electrode coupled to a write 0 voltage regulator 215 for receiving a write 0 voltage, a second current carrying electrode coupled to the node 211, and a control electrode coupled to receive the signal enwr0_lo[a]. A transistor 216 has a first current carrying electrode coupled to a write 1 voltage regulator 217 for receiving a write 1 voltage, a second current carrying electrode coupled to node 211, and a control electrode coupled to receive the signal enwr1_hi_b[a].

The above portion of the sense amplifiers and write drivers circuitry 112 is coupled to the source line 134 by a portion of the column selection circuitry 104 including a column selection transistor 218 having a first current carrying electrode coupled to the node 211 and a second current carrying electrode coupled to source line 134. The column selection transistor 218 preferably is a thin-oxide device with low threshold voltage for a higher current drive. A transistor 219 has a first current carrying electrode coupled to receive a precharge voltage vbq, a second current carrying electrode coupled to node 211, and a control electrode coupled to receive a delayed bit line precharge signal dlyblspq. A transistor 220 has a first current carrying electrode coupled to the control electrode of column selection transistor 218, a second current carrying electrode coupled to a reference voltage, and a control electrode coupled to receive a column select pulse signal pulse_cs[x]. A transistor 221 has a first current carrying electrode coupled to the control electrode of column selection transistor 218, a second current carrying electrode coupled to receive the column select pulse signal pulse_cs[x], and a control electrode coupled to receive a bit line precharge signal blspq[x].

The sense amplifiers and write drivers circuitry 114 of the second embodiment includes a transistor 232 having a first current carrying electrode coupled to a read voltage regulator 233 for receiving a read voltage, a second current carrying electrode coupled to a node 231, and a control electrode coupled to receive the signal enrd_lo[a]. A transistor 234 has a first current carrying electrode coupled to a write 0 voltage regulator 235 for receiving a write 0 voltage, a second current carrying electrode coupled to the node 231, and a control electrode coupled to receive the signal enwr0_lo[a]. A transistor 236 has a first current carrying electrode coupled to a write 1 voltage regulator 237 for receiving a write 1 voltage, a second current carrying electrode coupled to node 231, and a control electrode coupled to receive the signal enwr1_hi_b[a].

The above portion of the sense amplifiers and write drivers circuitry 114 is coupled to the source line 134 by a portion of the column selection circuitry 106 including a column selection transistor 238 having a first current carrying electrode coupled to the node 231 and a second current carrying electrode coupled to source line 134. The column selection transistor 238 preferably is a thin-oxide device with low threshold voltage for a higher current drive. A transistor 239 has a first current carrying electrode coupled to receive a precharge voltage vbq, a second current carrying electrode coupled to source line 134 and the second current carrying electrode of column selection transistor 238, and a control electrode coupled to receive a bit line precharge signal blspq[x]. A transistor 240 has a first current carrying electrode coupled to the control electrode of column selection transistor 238, a second current carrying electrode coupled to a reference voltage, and a control electrode coupled to receive a chip select pulse signal pulse_cs[x]. A transistor 241 has a first current carrying electrode coupled to the control electrode of column selection transistor 238, a second current carrying electrode coupled to a reference voltage, for example, ground, and a control electrode coupled to receive a bit line precharge signal blspq[x]. A transistor 242 has a first current carrying electrode coupled to receive a precharge voltage vbq, a second current carrying electrode coupled to the node 231, and a control electrode coupled to the delayed bit line precharge signal dlyblspq.

The sense amplifiers and write drivers circuitry 112 of the second embodiment further includes a transistor 252 having a first current carrying electrode coupled to a read voltage regulator 253 for receiving a read voltage, a second current carrying electrode coupled to a node 251, and a control electrode coupled to receive the signal enrd_lo[b]. A transistor 254 has a first current carrying electrode coupled to a write 0 voltage regulator 255 for receiving a write 0 voltage, a second current carrying electrode coupled to the node 251, and a control electrode coupled to receive the signal enwr0_lo[b]. A transistor 256 has a first current carrying electrode coupled to a write 1 voltage regulator 257 for receiving a write 1 voltage, a second current carrying electrode coupled to node 251, and a control electrode coupled to receive the signal enwr1_hi_b[b].

The above portion of the sense amplifiers and write drivers 112 is coupled to the source line 135 by a portion of the column selection circuitry 104 including a column selection transistor 258 having a first current carrying electrode coupled to the node 251 and a second current carrying electrode coupled to source line 135. The column selection transistor 258 preferably is a thin-oxide device with low threshold voltage for a higher current drive. A transistor 259 has a first current carrying electrode coupled to receive a precharge voltage vbq, a second current carrying electrode coupled to node 251, and a control electrode coupled to receive a delayed bit line precharge signal dlyblspq. A transistor 260 has a first current carrying electrode coupled to the control electrode of column selection transistor 258, a second current carrying electrode coupled to a reference voltage, and a control electrode coupled to receive a column select pulse signal pulse_cs[y]. A transistor 261 has a first current carrying electrode coupled to the control electrode of column selection transistor 258, a second current carrying electrode coupled to a reference, for example, ground, and a control electrode coupled to receive a bit line precharge signal blspq[y]. A transistor 262 has a first current carrying electrode coupled to the precharge voltage vbq, a second current carrying electrode coupled to the source line 135, and a control electrode coupled to receive the bit line precharge voltage blspq[y].

The sense amplifiers and write drivers circuitry 114 of the second embodiment further includes a transistor 272 having a first current carrying electrode coupled to a read voltage regulator 273 for receiving a read voltage, a second current carrying electrode coupled to a node 271, and a control electrode coupled to receive the signal enrd_lo[b]. A transistor 274 has a first current carrying electrode coupled to a write 0 voltage regulator 275 for receiving a write 0 voltage, a second current carrying electrode coupled to the node 271, and a control electrode coupled to receive the signal enwr0_lo[b]. A transistor 276 has a first current carrying electrode coupled to a write 1 voltage regulator 277 for receiving a write 1 voltage, a second current carrying electrode coupled to node 271, and a control electrode coupled to receive the signal enwr1_hi_b[b].

The above portion of the sense amplifiers and write drivers circuitry 114 is coupled to the source line 135 by a portion of the column selection circuitry 106 including a column selection transistor 278 having a first current carrying electrode coupled to the node 271 and a second current carrying electrode coupled to source line 135. The column selection transistor 278 preferably is a thin-oxide device with low threshold voltage for a higher current drive. A transistor 280 has a first current carrying electrode coupled to the control electrode of column selection transistor 278, a second current carrying electrode coupled to a reference voltage, and a control electrode coupled to receive a column select pulse signal pulse_cs[y]. A transistor 281 has a first current carrying electrode coupled to the control electrode of column selection transistor 278, a second current carrying electrode coupled to receive a column select pulse voltage pulse_cs[y], and a control electrode coupled to receive a bit line precharge signal blspq[y]. A transistor 282 has a first current carrying electrode coupled to receive a precharge voltage vbq, a second current carrying electrode coupled to the node 271, and a control electrode coupled to the delayed bit line precharge signal dlyblspq.

Figure 2C:
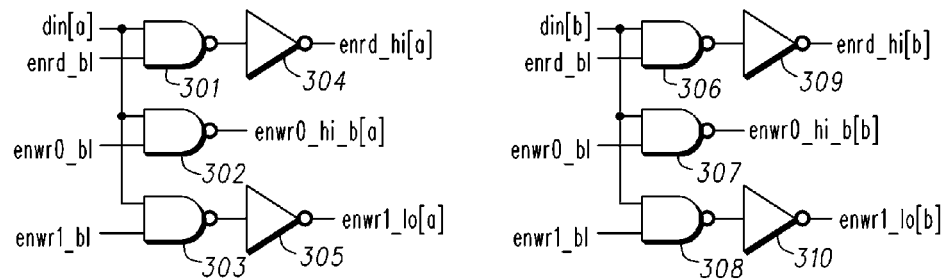
Figure 2D:
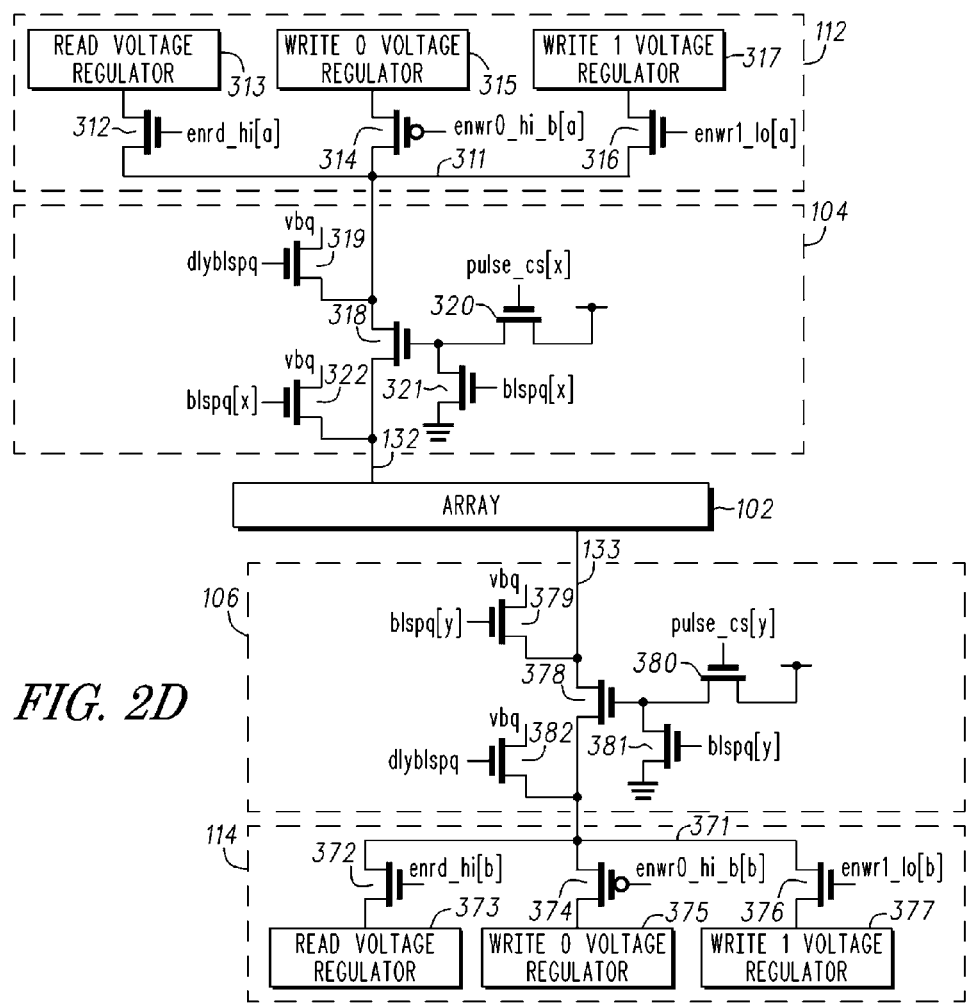

Referring to FIG. 2C, NAND gates 301, 302, 303 each have a first input coupled to receive the first data input signal din[a], and a second input coupled to receive a bit line enable read signal enrd_bl, a bit line enable write 0 signal enwr0_bl, and a bit line enable write 1 signal enwr1_bl, respectively. An inverter 304 has an input coupled to receive an output of the NAND gate 301 and provides a first enable read high signal enrd_hi[a]. An inverter 305 has an input coupled to receive an output of the NAND gate 303 and provides a first enable write 1 low signal enwr1_lo[a]. An output of the NAND gate 302 provides a first enable write 0 high signal enwr0_hi_b[a].

NAND gates 306, 307, 308 each have a first input coupled to receive the second data input signal din[b], and a second input coupled to receive the bit line enable read signal enrd_bl, the bit line enable write 0 signal enwr0_bl, and the bit line enable write 1 signal enwr1_bl, respectively. An inverter 309 has an input coupled to receive an output of the NAND gate 306 and provides a second enable read high signal enrd_hi[b]. An inverter 310 has an input coupled to receive an output of the NAND gate 308 and provides a second enable write 1 low signal enwr1_lo[b]. An output of the NAND gate 307 provides a second enable write 0 high signal enwr0_hi_b[b].

The sense amplifiers and write drivers circuitry 112 (FIG. 2D) of the second embodiment further includes a transistor 312 having a first current carrying electrode coupled to a read voltage regulator 313 for receiving a read voltage, a second current carrying electrode coupled to a node 311, and a control electrode coupled to receive the signal enrd_hi[a]. A transistor 314 has a first current carrying electrode coupled to a write 0 voltage regulator 315 for receiving a write 0 voltage, a second current carrying electrode coupled to the node 311, and a control electrode coupled to receive the signal enwr0_hi_b[a]. A transistor 316 has a first current carrying electrode coupled to a write 1 voltage regulator 317 for receiving a write 1 voltage, a second current carrying electrode coupled to node 311, and a control electrode coupled to receive the signal enwr1_lo[a].

The above portion of the sense amplifiers and write drivers 112 is coupled to the bit line 132 by a portion of the column selection circuitry 104 including a column selection transistor 318 having a first current carrying electrode coupled to the node 311 and a second current carrying electrode coupled to bit line 132. The column selection transistor 318 preferably is a thin-oxide device with low threshold voltage for a higher current drive. A transistor 319 has a first current carrying electrode coupled to receive a precharge voltage vbq, a second current carrying electrode coupled to node 311, and a control electrode coupled to receive a delayed bit line precharge signal dlyblspq. A transistor 320 has a first current carrying electrode coupled to the control electrode of column selection transistor 318, a second current carrying electrode coupled to a reference voltage, and a control electrode coupled to receive a column select pulse signal pulse_cs[x]. A transistor 321 has a first current carrying electrode coupled to the control electrode of column selection transistor 318, a second current carrying electrode coupled to a reference voltage, for example, ground, and a control electrode coupled to receive a bit line precharge signal blspq[x]. A transistor 322 has a first current carrying electrode coupled to receive a precharge voltage vbq, a second current carrying electrode coupled to the bit line 132, and a control electrode coupled to the bit line precharge signal blspq[x].

The sense amplifiers and write drivers circuitry 114 of the second embodiment further includes a transistor 372 having a first current carrying electrode coupled to a read voltage regulator 373 for receiving a read voltage, a second current carrying electrode coupled to a node 371, and a control electrode coupled to receive the signal enrd_hi[b]. A transistor 374 has a first current carrying electrode coupled to a write 0 voltage regulator 375 for receiving a write 0 voltage, a second current carrying electrode coupled to the node 371, and a control electrode coupled to receive the signal enwr0_hi_b[b]. A transistor 376 has a first current carrying electrode coupled to a write 1 voltage regulator 377 for receiving a write 1 voltage, a second current carrying electrode coupled to node 371, and a control electrode coupled to receive the signal enwr1_lo[b].

The above portion of the sense amplifiers and write drivers circuitry 114 is coupled to the bit line 133 by a portion of the column selection circuitry 106 including a column selection transistor 378 having a first current carrying electrode coupled to the node 371 and a second current carrying electrode coupled to bit line 133. The column selection transistor 378 preferably is a thin-oxide device with low threshold voltage for a higher current drive. A transistor 380 has a first current carrying electrode coupled to the control electrode of column selection transistor 378, a second current carrying electrode coupled to a reference voltage, and a control electrode coupled to receive the column select pulse signal pulse_cs[y]. A transistor 381 has a first current carrying electrode coupled to the control electrode of column selection transistor 378, a second current carrying electrode coupled to a reference voltage, for example, ground, and a control electrode coupled to receive a bit line precharge signal blspq[y]. A transistor 382 has a first current carrying electrode coupled to receive a precharge voltage vbq, a second current carrying electrode coupled to the node 371, and a control electrode coupled to the delayed bit line precharge signal dlyblspq. A transistor 379 has a first current carrying electrode coupled to receive a precharge voltage vbq, a second current carrying electrode coupled to the bit line 133, and a control electrode coupled to the bit line precharge signal blspq[y].

Figure 3:
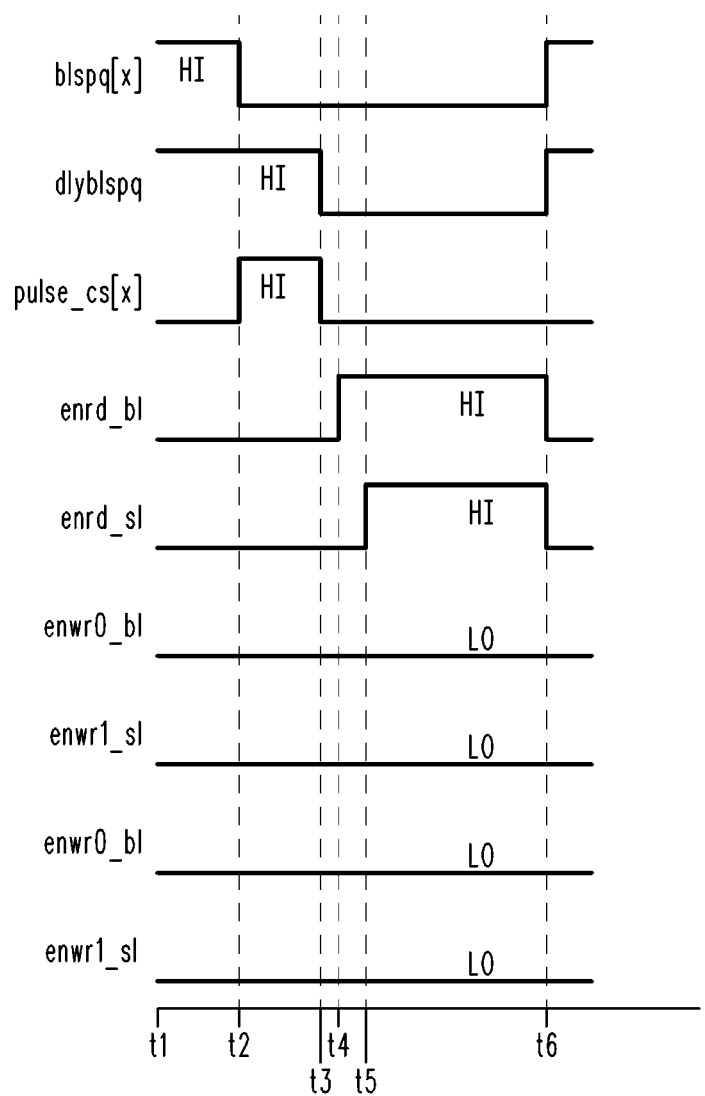
FIG. 3 is a timing diagram describing the operation of reading data from the second exemplary embodiment.
Figure 4:
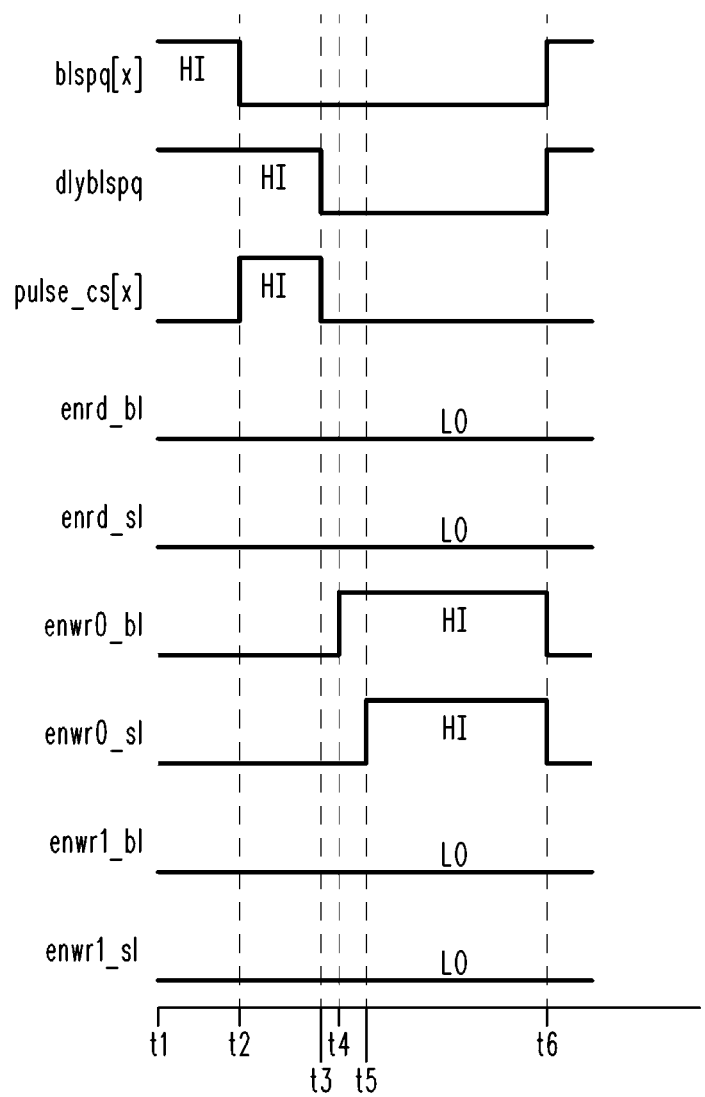
FIG. 4 is a timing diagram describing the operation of writing a first state to the second exemplary embodiment.
Figure 5:
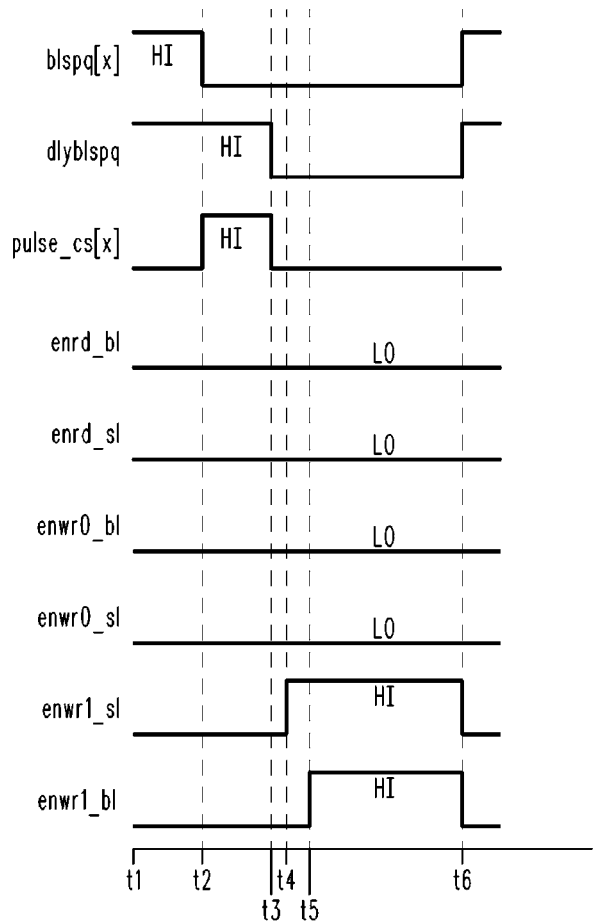
FIG. 5 is a timing diagram describing the operation of writing a second state to the second exemplary embodiment.

FIGS. 3, 4, and 5 are timing diagrams (signal state versus time) for a portion of the signals of the second embodiment, including timing waveforms for reading the state of a cell (FIG. 3), timing waveforms for writing a 0 or low state to a cell (FIG. 4), and timing waveforms for writing a 1 or high state to a cell (FIG. 5). FIGS. 3, 4, and 5 indicate signal states as HI (high) being a high voltage and LO (low) being ground or any voltage lower than the high voltage. Furthermore, the signal state HI may comprise multiple high voltage levels at different times.

In operation, when the ST-MRAM 100 is powered up and not performing read or write operations, the portion of the signals illustrated in FIGS. 3, 4, and 5 are at states according to time t1 in any of FIGS. 3, 4, and 5. The bit line precharge signal blspq[x] is high which (a) enables transistor 239 that pulls source line 134 to precharge voltage vbq, and (b) enables transistor 322 that pulls bit line 132 to precharge voltage vbq. While not shown in FIGS. 3, 4, and 5, the bit line precharge signal blspq[y] is high as well at time t1 which (a) enables transistor 262 that pulls source line 135 to precharge voltage vbq, and (b) enables transistor 379 that pulls bit line 133 to precharge voltage vbq. Thus, source line 134, 135 and bit line 132, 133 are pulled to a precharge voltage vbq from one end. The high states of blspq[x] and blspq[y] at the same time disables the column selection transistors 218, 238, 318, and columns selection transistors 258, 278, and 378, respectively, by pulling their control electrodes to a low voltage, for example, ground. During this time, the column select pulse signals pulse_cs[x] (shown in FIGS. 3, 4, and 5) and pulse_cs[y] are low. Therefore, none of the bit lines 132, 133, and source lines 134, 135 is selected as the column selection transistors are disabled. The delayed bit line precharge signal dlyblspq is high enabling transistors 219, 242, 259, 282, 319, and 382 to apply the precharge voltage vbq to nodes 211, 231, 251, 271, 311, and 371, respectively. Both current carrying electrodes of the column selection transistors are thus held at the precharge voltage vbq. While not shown in FIGS. 3, 4, and 5, all the word line 136 may be at a low voltage or ground to ensure none of the word line select transistors 130 is enabled at time t1 when the ST-MRAM 100 is powered up and not performing read or write operations.

Referring to FIG. 3, blspq[x] is set to low and pulse_cs[x] is set to high to initiate a column selection at time t2 for a read operation. The blspq[x] signal low disconnects the source line 134 and bit line 132 from the vbq precharge voltage causing the source line 134 and bit line 132 to float and disables the pull-down at the control electrodes of the column selection transistors connected to source line 134 and bit line 132. The pulse_cs[x] signal high connects the control electrodes of column selection transistors 218, 238, and 318 to a reference voltage through transistors 220, 240, and 320, respectively. At time t3 which is after a delay of td1 from t2, the pulse_cs[x] signal is set to low causing the control electrodes of column selection transistors 218, 238, and 318 to float. The delayed bit line precharge signal dlyblspq is also set to low at time t3 to disable transistors 219, 242, 259, 282, 319, and 382 which in turn floats nodes 211, 231, 251, 271, 311, and 371, respectively. The above sequence selects source line 134 and bit line 132 by disconnecting them from the precharge voltage vbq and by floating the control electrodes of column selection transistors 218 and 238, corresponding to source line 134, and column selection transistor 318, corresponding to bit line 132, after precharging the control electrodes of the column selection transistors to a reference voltage. While not shown in FIG. 3, one of the word line 136 is set to high during any time between t1 and t3 to select a row of word line select transistors 130 in the bit cell array 102.

Subsequently at time t4, the bit line enable read signal enrd_bl is set to high which enables transistor 312 through NAND gate 301 and inverter 304 when din[a] is high. The read voltage regulator 313 applies a high voltage (pull-up) to bit line 132 through transistors 312 and 318. The read voltage regulator 313 may comprise an NMOS source follower circuit further comprising at least an NMOS-follower transistor. At time t5 which is after a delay of td2 from t4, the source line enable read signal enrd_sl is set to high. The signal enrd_sl high enables transistors 212 and 232 through NAND gate 201 and inverter 204 when din[a] is high. The read voltage regulators 213 and 233 apply a low voltage (pull-down) to source line 134 through transistor pairs 212 and 218, and 232 and 238, respectively. Each of the read voltage regulators 213 and 233 may comprise a PMOS source follower circuit further comprising of a PMOS-follower transistor. The delay td2 can a fixed delay or a programmable delay programmed by writing to a register. Note that the delay td2 causes the high voltage application to bit line 132 to initiate earlier than the low voltage application to source line 134 during a read operation. At time t6, both enrd_bl and enrd_sl are set to low to stop the application of read voltages at the source line 134 and bit line 132. The blspq[x] and dlyblspq are set to high to disable the associated column selection transistors and precharge the source line 134 and bit line 132 to voltage vbq. While not shown in FIG. 3, the signals transitioning at time t6 may transition in any order and with any delay between each other. Furthermore, the selected word line 136 may be set to low at time t6 (not shown). During the read operation from the selected source line 134 and bit line 132, the unselected source line 135 and bit line 133 are maintained at the precharge voltage level vbq by transistors 262 and 379, respectively.

Referring to FIG. 4, blspq[x] is set to low and pulse_cs[x] is set to high to initiate a column selection at time t2 for a write 0 operation. The shown sequence of signals blspq[x], dlyblspq, and pulse_cs[x] until time t3 is the same as in that of a read operation (FIG. 3) described earlier to select source line 134 and bit line 132. While not shown in FIG. 4, one of the word line 136 is set to high during any time between t1 and t3 to select a row of word line select transistors 130 in the bit cell array 102. The magnitude of the voltage level of the selected word line 136 during a write 0 operation is determined by the magnitude of the voltages applied to source line 134 and bit line 132 during a write 0 operation, and configured to achieve the maximum voltage allowed, for e.g. 1.65V, across the control electrode and any one of the current carrying electrodes for maintaining reliable operation of the word line select transistor 130. The maximum voltage allowed can be estimated based on a desired lifetime for time dependent dielectric breakdown of the word line select transistors 130 connected to the selected word line 136. The high voltage levels of the selected word line 136 during write 0 and read operations may be the same voltage level.

Subsequently at time t4, the bit line enable write 0 signal enwr0_bl is set to high which enables transistor 314 through NAND gate 302 when din[a] is high. The write 0 voltage regulator 315 applies a high voltage (pull-up) to bit line 132 through transistors 314 and 318. The write 0 voltage regulator 315 may comprise an NMOS source follower circuit further comprising of an NMOS-follower transistor. At time t5 which is after the delay of td2 from t4, the source line enable write 0 signal enwr0_sl is set to high. The enwr0_sl high enables transistors 214 and 234 through NAND gate 202 and inverter 205 when din[a] is high. The write 0 voltage regulators 215 and 235 apply a low voltage (pull-down) to source line 134 through transistor pairs 214 and 218, and 234 and 238, respectively. Each of the write 0 voltage regulators 215 and 235 may comprise a PMOS source follower circuit further comprising a PMOS-follower transistor. Note that the delay td2 causes the high voltage application to bit line 132 to initiate earlier than the low voltage application to source line 134 during a write 0 operation. At time t6, both signals enwr0_bl and enwr0_sl are set to low to stop the application of write 0 voltages at the source line 134 and bit line 132. The signals blspq[x] and dlyblspq are set to high to disable the associated column selection transistors and precharge the source line 134 and bit line 132 to voltage vbq. While not shown in FIG. 4, the signals transitioning at time t6 may transition in any order and with any delay between each other. Furthermore, the selected word line 136 may be set to low at time t6 (not shown). During the write 0 operation from the selected source line 134 and bit line 132, the unselected source line 135 and bit line 133 are maintained at the precharge voltage level vbq by transistors 262 and 379, respectively.

Referring to FIG. 5, blspq[x] is set to low and pulse_cs[x] is set to high to initiate a column selection at time t2 for a write 1 operation. The shown sequence of signals blspq[x], dlyblspq, and pulse_cs[x] until time t3 is the same as in that of a read operation (FIG. 3) described earlier to select source line 134 and bit line 132. While not shown in FIG. 5, one of the word line 136 is set to high during any time between t1 and t3 to select a row of word line select transistors 130 in the bit cell array 102. Furthermore, the high voltage level of the selected word line 136 during a write 1 operation may be different than the high voltage level of the selected word line 136 during a write 0 or read operation. The magnitude of the voltage level of the selected word line 136 during a write 1 operation is determined by the magnitude of the voltages applied to source line 134 and bit line 132 during a write 1 operation, and configured to achieve the maximum voltage allowed, for e.g. 1.65V, across the control electrode and any one of the current carrying electrodes for maintaining reliable operation of the word line select transistor 130. The maximum voltage allowed can be estimated based on a desired lifetime for time dependent dielectric breakdown of the word line select transistors 130 connected to the selected word line 136.

Subsequently at time t4, the source line enable write 1 signal enwr1_sl is set to high which enables transistors 216 and 236 through NAND gate 203 when din[a] is high. The write 1 voltage regulators 217 and 237 apply a high voltage (pull-up) to source line 134 through transistor pairs 216 and 218, and 236 and 238, respectively. Each of the write 1 voltage regulators 217 and 237 may comprise an NMOS source follower circuit further comprising an NMOS-follower transistor. At time t5 which is after the delay of td2 from t4, the bit line enable write 1 signal enwr1_bl is set to high. The signal enwr1_bl high enables transistor 316 through NAND gate 303 and inverter 305 when din[a] is high. The write 1 voltage regulator 317 applies a low voltage (pull-down) to bit line 132 through transistor 316 and 318. The write 1 voltage regulator 317 may comprise a PMOS source follower circuit further comprising a PMOS-follower transistor. Note that the delay td2 causes the high voltage application to source line 134 to initiate earlier than the low voltage application to bit line 132 during a write 1 operation. At time t6, both signals enwr1_sl and enwr1_bl are set to low to stop the application of write 1 voltages at the source line 134 and bit line 132. The signals blspq[x] and dlyblspq are set to high to disable the associated column selection transistors and precharge the source line 134 and bit line 132 to voltage vbq. While not shown in FIG. 5, the signals transitioning at time t6 may transition in any order and with any delay between each other. Furthermore, the selected word line 136 may be set to low at time t6 (not shown). During the write 1 operation from the selected source line 134 and bit line 132, the unselected source line 135 and bit line 133 are maintained at the precharge voltage level vbq by transistors 262 and 379, respectively. The magnitude of the precharge voltage level vbq is determined by the highest magnitude of the selected word line 136 when set to high during write 1, write 0, and read operations, and configured to achieve the maximum voltage allowed, for e.g. 1.65V, across the control electrode and any one of the current carrying electrodes for maintaining reliable operation of the word line select transistor 130 in the unselected source line 135 and bit line 133.

Figure 6:
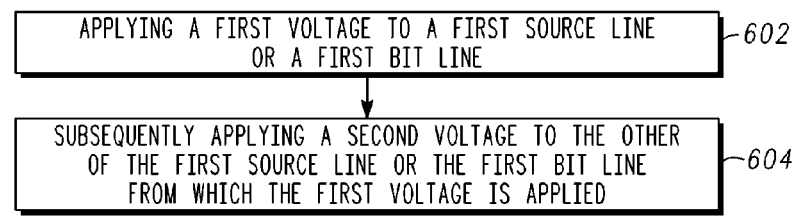
FIG. 6 is a flow chart of a method of reading and writing an ST-MRAM in accordance with the first exemplary embodiment.
Figure 7:
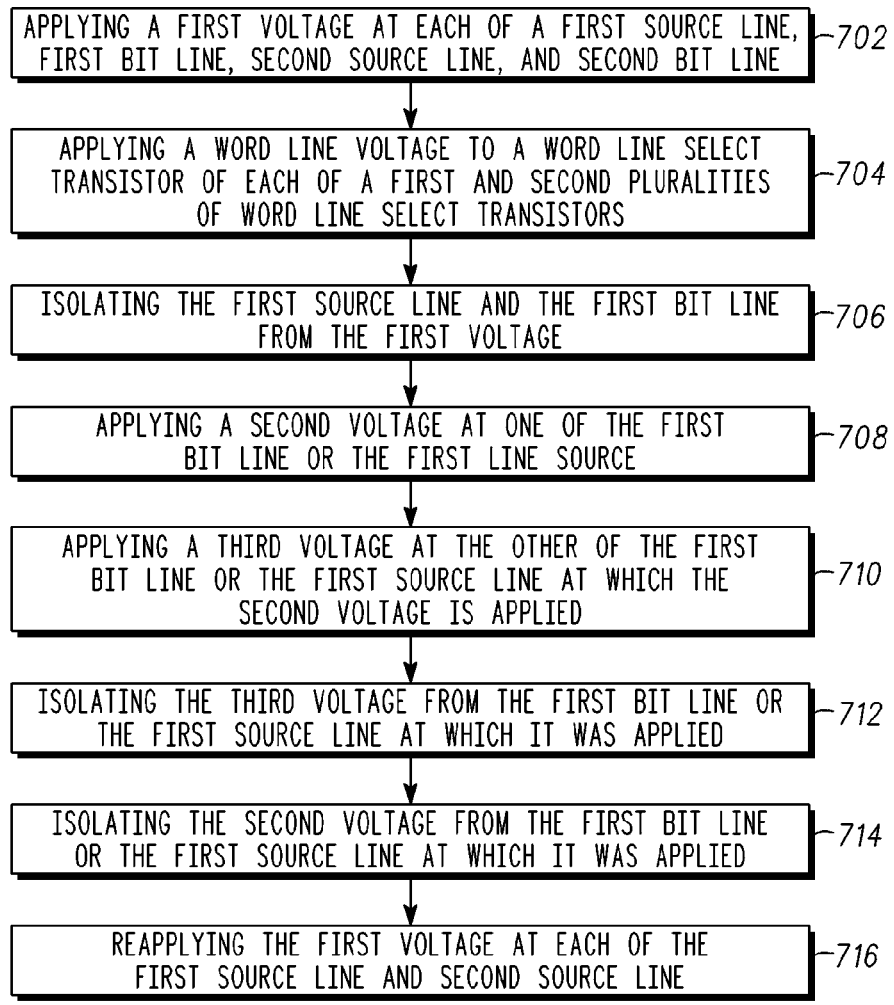
FIG. 7 is a flow chart of a method of reading and writing an ST-MRAM in accordance with the second exemplary embodiment.

FIGS. 6 and 7 are flow charts that illustrate exemplary embodiments of methods 600, 700 of reading and writing to a spin-torque MRAM. The various tasks performed in connection with methods 600, 700 may be performed by hardware, firmware, or any combination thereof. For illustrative purposes, the description of methods 600, 700 refer to elements mentioned above in connection with FIGS. 1 and 2. It should be appreciated that methods 600, 700 may include any number of additional or alternative tasks, the tasks shown in FIGS. 3, and 5 need not be performed in the illustrated order, and methods 600, 700 may be incorporated into a more comprehensive procedure or method having additional functionality not described in detail herein. Moreover, one or more of the tasks shown in FIGS. 6 and 7 could be omitted from an embodiment of the methods 600, 700 as long as the intended overall functionality remains intact.

Referring to FIG. 6, a method of the first exemplary embodiment includes writing to and reading from a spin-torque MRAM having a first source line, a second source line, a first bit line, a second bit line, a first plurality of magnetic tunnel junction cells coupled between the first source line and the first bit line, and a second plurality of magnetic tunnel junction cells coupled between the second source line and the second bit line, comprising applying 602 a first voltage to the first source line or the first bit line; and subsequently applying 604 a second voltage to the other of the first source line or the first bit line from which the first voltage is applied.

A method (see FIG. 7) in accordance with the second exemplary embodiment includes method for writing to and reading from a spin-torque MRAM having a first source line, a second source line, a first bit line, a second bit line, each of a first plurality of magnetic tunnel junction cells coupled in series with one each of a plurality of word line select transistors between the first source line and the first bit line, and a second plurality of magnetic tunnel junction cells coupled in series with one each of a second plurality of word line select transistors between the second source line and the second bit line, comprising applying 702 a first voltage at each of the first source line, first bit line, second source line, and second bit line; applying 704 a word line voltage to one word line select transistor of each first and second pluralities of word line select transistors; isolating 706 the first source line and first bit line from the first voltage; applying 708 a second voltage at one of the first bit line or first source line; applying 710 a third voltage at the other of the first bit line or first source line at which the second voltage is applied; isolating 712 the third voltage from the first bit line or first source line at which it was applied; isolating 714 the second voltage from the first bit line or first source line at which it was applied; and reapplying 716 the first voltage at each of the first source line and second source line.

In summary, an ST-MRAM array comprises of a plurality of Magnetic tunnel Junctions, each coupled to a transistor connected to each of a plurality of source lines and bit lines. All the bit lines and source lines are elevated to a higher (than ground) voltage, vbq, during power up and in steady state. During a read or write operation, only the selected (an addressed subset of all) bit line and source lines are pulled-down to a low voltage and/or pulled-up to a high voltage depending on the operation (write 0, write 1, and read) being performed. The unselected bit lines and source lines are held at the vbq voltage level. Note that none of the bit lines and source lines is pulled down to zero or ground voltage level during read or write operation. The bit lines and source lines voltage levels are higher than that of a ground or zero voltage level. The precharge voltage vbq voltage level is about 600 millivolts.

Separately timed switch control signals and a logic circuit are used for pull-up or pull-down of the selected bit lines and source lines during read and write operations. A method of operation further includes delaying pull-down timing from pull-up timing by a fixed or programmable delay. During power-up and steady state, all the bit lines and source lines are precharged to vbq level with a precharge transistor on each side (current carrying electrodes) of the column selection transistor in each bit line and source line. In response to a read or write operation, the vbq precharge transistor of the selected column at the bit line/source line side of the column selection transistor is disabled first. Subsequently (by a fixed or programmable delay) the vbq precharge transistor at the opposite side of the selected column selection transistor is disabled. Column selection transistors are placed at both the top and bottom sides of the array.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of operation of a magnetoresistive memory that includes a plurality of magnetic bit cells, each magnetic bit cell of the plurality of magnetic bit cells including a magnetic tunnel junction coupled in series with a select transistor, the method comprising:
    pulling a first end of each magnetic bit cell of the plurality of magnetic bit cells to a precharge voltage;
    pulling a second end of each magnetic bit cell of the plurality of magnetic bit cells to the precharge voltage; and
    after pulling the first and second ends of each magnetic bit cell to the precharge voltage:
        applying a first voltage at the first end of a selected magnetic bit cell of the plurality of magnetic bit cells;
        setting a word line to a high voltage level, where the word line is coupled to the select transistor of the selected magnetic bit cell;
        delaying for a delay after applying the first voltage; and
        after delaying for the delay, applying a second voltage at the second end of the selected magnetic bit cell.

2. The method of claim 1, wherein the delay is a fixed delay.

3. The method of claim 1, wherein the delay is a programmable delay.

4. The method of claim 3, further comprising:
    writing to a register to program the programmable delay.

5. The method of claim 1, wherein each magnetic bit cell is selectively coupled between a corresponding bit line of a plurality of bit lines and a corresponding source line of a plurality of source lines, wherein pulling the first and second ends of each magnetic bit cell to the precharge voltage further comprises pulling the plurality of bit lines and the plurality of source lines to the precharge voltage.

6. The method of claim 1, wherein the first end of the selected magnetic bit cell is coupled to a first common line, wherein the second end of the selected magnetic bit cell is coupled to a second common line, and wherein pulling the first and second ends of the selected magnetic bit cell to the precharge voltage further comprises pulling the first common line and the second common line to the precharge voltage.

7. The method of claim 6, further comprising:
    after pulling the first and second common lines to the precharge voltage and prior to applying the first voltage, disconnecting the first and second common lines from the precharge voltage.

8. The method of claim 7 further comprises:
    while applying the first voltage, holding additional common lines at the precharge voltage, wherein the additional common lines are coupled to unselected magnetic bit cells of the plurality of magnetic bit cells.

9. The method of claim 1, wherein applying the first voltage further comprises applying a high voltage, and wherein applying the second voltage further comprises applying a low voltage.

10. The method of claim 1, wherein setting the word line to the high voltage level further comprises setting the word line to the high voltage level using a charge-pumped voltage.

11. The method of claim 1, wherein setting the word line to the high voltage level further comprises setting the word line to a high voltage level having a magnitude based on at least one of the first voltage and the second voltage.

12. The method of claim 11, wherein the precharge voltage is based on the magnitude of the high voltage level of the word line.

13. The method of claim 1 further comprising generating separately timed switch control signals, wherein the separately timed switch control signals are used in applying the first and second voltages.

14. A method of operation of a magnetoresistive memory, wherein the magnetoresistive memory includes a first magnetoresistive bit cell and a second magnetoresistive bit cell, each of the first and second magnetoresistive bit cells including a magnetic tunnel junction coupled in series with a corresponding selection transistor, the method comprising:
- pulling a first end of the first magnetoresistive bit cell to a precharge voltage;
- pulling a second end of the first magnetoresistive bit cell to the precharge voltage;
- pulling a first end of the second magnetoresistive bit cell to the precharge voltage;
- pulling a second end of the second magnetoresistive bit cell to the precharge voltage; and
- after pulling the first and second ends of the first magnetoresistive bit cell to the precharge voltage:
  - applying a word line voltage to the selection transistor of the first magnetoresistive bit cell;
  - applying a first voltage to the first end of the first magnetoresistive bit cell, wherein timing of applying the first voltage is based on a first control signal; and
  - after applying the first voltage, applying a second voltage to the second end of the first magnetoresistive bit cell, wherein the first voltage is greater than the second voltage, and wherein timing of applying the second voltage is based on a second control signal.

15. The method of claim 14, further comprises disconnecting the first and second ends of the first magnetoresistive bit cell from the precharge voltage before applying the first voltage.

16. The method of claim 14, wherein applying the word line voltage further comprises applying a word line voltage having a magnitude based on at least one of the first voltage and the second voltage.

17. The method of claim 14, wherein the precharge voltage is based on a magnitude of the word line voltage.

18. A method of operation of a magnetoresistive memory, wherein the magnetoresistive memory includes a first magnetoresistive bit cell and a second magnetoresistive bit cell, each of the first and second magnetoresistive bit cells including a magnetic tunnel junction coupled in series with a corresponding selection transistor, the method comprising:
- pulling a first end of the first magnetoresistive bit cell to a precharge voltage;
- pulling a second end of the first magnetoresistive bit cell to the precharge voltage;
- pulling a first end of the second magnetoresistive bit cell to the precharge voltage;
- pulling a second end of the second magnetoresistive bit cell to the precharge voltage;
- disconnecting the first and second ends of the first magnetoresistive bit cell from the precharge voltage; and
- after disconnecting, and while maintaining the first and second ends of the second magnetoresistive bit cell at the precharge voltage:
  - applying a word line voltage to the selection transistor of the first magnetoresistive bit cell, wherein magnitude of the word line voltage is based on a first voltage and a second voltage;
  - applying the first voltage to the first end of the first magnetoresistive bit cell; and
  - applying the second voltage to the second end of the first magnetoresistive bit cell, wherein the first voltage is greater than the second voltage, and wherein timing of applying the second voltage is delayed from timing of applying the first voltage.

19. The method of claim 18, wherein the precharge voltage is based on the magnitude of the word line voltage.

20. The method of claim 18, wherein applying the first voltage further comprises applying the first voltage at both ends of a common line coupled to the first end of the first magnetoresistive bit cell.

* * * * *